United States Patent
Kim et al.

(10) Patent No.: US 8,149,621 B2
(45) Date of Patent: Apr. 3, 2012

(54) FLASH MEMORY DEVICE AND METHOD OF TESTING THE FLASH MEMORY DEVICE

(75) Inventors: Bo-geun Kim, Gyeonggi-do (KR); Dae-yong Kim, Hwaseong-si (KR); Jun-yong Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 267 days.

(21) Appl. No.: 12/585,725

(22) Filed: Sep. 23, 2009

(65) Prior Publication Data
US 2010/0103743 A1 Apr. 29, 2010

(30) Foreign Application Priority Data
Oct. 29, 2008 (KR) .................. 10-2008-0106589

(51) Int. Cl.
*G11C 11/34* (2006.01)
(52) U.S. Cl. ......... 365/185.11; 365/185.12; 365/185.09; 365/200; 365/201
(58) Field of Classification Search ............. 365/185.11, 365/185.12, 185.09, 200, 201
See application file for complete search history.

(56) References Cited

U.S. PATENT DOCUMENTS

| | | | |
|---|---|---|---|
| 6,826,081 B2 | 11/2004 | Nagashima et al. | |
| 2004/0042280 A1* | 3/2004 | Nagashima et al. | 365/200 |
| 2005/0068816 A1* | 3/2005 | Yoshimatsu et al. | 365/201 |
| 2005/0105333 A1* | 5/2005 | Park et al. | 365/185.17 |
| 2009/0282305 A1* | 11/2009 | Chen et al. | 714/718 |

FOREIGN PATENT DOCUMENTS

| | | |
|---|---|---|
| JP | 2003-151291 | 5/2003 |
| KR | 10-2005-0071738 | 7/2005 |
| KR | 10-2006-0102911 | 9/2006 |

* cited by examiner

*Primary Examiner* — Vu Le
*Assistant Examiner* — Han Yang
(74) *Attorney, Agent, or Firm* — Harness, Dickey & Pierce, P.L.C.

(57) ABSTRACT

A flash memory device and a method of testing the flash memory device are provided. The flash memory device may include a memory cell array including a plurality of bit lines, a control unit configured to output estimated data and an input/output buffer unit including a plurality of page buffers. Each of the plurality of page buffers corresponds to one of the plurality of bit lines in the memory cell array and is configured to read test data programmed in at least a first page of a memory cell array, compare the read-out test data with the estimated data to determine whether the corresponding bit line is in a pass or failure state and output a test result signal. A voltage of the test result signal is maintained when test data of a second page of the memory cell array is read if the corresponding bit line in the first page is in a failure state.

16 Claims, 7 Drawing Sheets

FIG. 5

| | S420 | S430 | S450 | S460 |
|---|---|---|---|---|
| LOAD | L | H | L | H |
| BLSHF | L | H | L | H |
| PBSLT | L | H | L | L |
| DI$_i$ | H | L | L | EDTA "1" → H<br>EDTA "0" → L |
| DI$_j$ | L | L | EDTA "1" → L<br>EDTA "0" → H | EDTA "1" → L<br>EDTA "0" → H |
| SO | H | Don't care | H | TDTA "1" → L<br>TDTA "0" → H |
| NA | L | Don't care | L | EDTA = TDTA → L<br>EDTA ≠ TDTA → H |
| NB | H | Don't care | H | EDTA = TDTA → H<br>EDTA ≠ TDTA → L |
| NO | H | Don't care | H | EDTA = TDTA → H<br>EDTA ≠ TDTA → L |

FLASH MEMORY DEVICE AND METHOD OF TESTING THE FLASH MEMORY DEVICE

CROSS-REFERENCE TO RELATED APPLICATION

This application claims priority to Korean Patent Application No. 10-2008-0106589, filed on Oct. 29, 2008, in the Korean Intellectual Property Office, the entire contents of which are incorporated herein by reference.

BACKGROUND

Example embodiments are directed, to a flash memory device and a method of testing the flash memory device.

SUMMARY

Example embodiments provide a flash memory device capable of reducing the time required to undergo testing, and a method of testing the flash memory device.

According to example embodiments there is provided a flash memory device including an input/output buffer unit including page buffers which read test data programmed in a first page of a memory cell array, compare the read-out test data with estimated data corresponding to the test data, and output test result signals for their corresponding columns in a test mode. A control unit controls an operation of the input/output buffer unit in the test mode.

Each of the page buffers may include an output node outputting a test result signal that represents whether a column corresponding to the output node is in a pass or failure state, a precharge transistor located between a bit line corresponding to the precharge transistor from among bit lines of the memory cell array and the output node, the precharge transistor precharging the bit line with a voltage with a voltage level of the output node in response to a precharge control signal in the test mode, a sensing node connected to the bit line and receiving a voltage with a voltage level corresponding to a bit value of the test data read from the precharged bit line and a latch being activated or inactive according to the voltage level of the sensing node and applying a voltage with a voltage level which depends on whether the read-out test data and the estimated data are identical.

When the column is in a failure state, the output node may have a voltage level of logic low. Accordingly, the bit line is not precharged when a second page is tested after the testing of the first page. The latch is inactive.

The test result signal may have an identical logic level for all pages that are tested after the first page. When the test data is programmed in a normal cell other than a defective cell, the estimated data and the test data have the same bit values.

The latch may include a first node having a voltage level which is reverse to a voltage level of the output node, a second node having a voltage level which is reverse to the voltage level of the first node, a first transistor connected between the first node and a source of a ground voltage, and generating a first current path in response to a first signal and a second transistor connected between the second node and the source of the ground voltage, and generating a second current path in response to a second signal.

The first node may have a voltage of logic low due to the generation of the first current path, and the second node may have a voltage of logic low due to the generation of the second current path.

While the precharged bit line is being developed, the control unit may set the sensing node to have a voltage of a first logic which activates the latch, and set the logic levels of the first and second signals so that one of the first and second current paths depends on a bit value of the estimated data. Each of the page buffers may further include a load transistor which applies a voltage of the first logic to the sensing node in response to a third signal transmitted from the controller.

While the developed bit line is being sensed, the control unit may set logic levels of the first and second signals so that the first current path or the second current path is generated according to the bit value of the estimated data.

Each of the page buffers may further include an inverter which is connected between the first node and the output node. Each of the page buffers may also further include a switch which is connected to the output node and outputs the test signal with a logic level corresponding to the logic level of the output node to the outside in response to a switching signal received from the control unit when all of the pages of the memory cell array are completely tested.

According to example embodiments, there is provided a method of testing the flash memory device. The method includes programming the test data in the memory cell array, precharging the bit line with a voltage of a voltage level corresponding to the voltage level of the output node, developing the precharged bit line, setting the voltage of the first node of the latch connected to the output node, according to the estimated data, while the bit line is being developed or after the bit line is developed, sensing the bit line and maintaining or inverting the voltage of the first node of the latch according to whether the voltage level of the sensing node is identical with the voltage level of the estimated data.

BRIEF DESCRIPTION OF THE DRAWINGS

Example embodiments will be more clearly understood from the following detailed description taken in conjunction with the accompanying drawings in which:

FIG. 5 is a table showing logic levels of signals and nodes illustrated n FIG. 3 according to operations of the method illustrated in FIG. 4;

DETAILED DESCRIPTION

Figure 1:
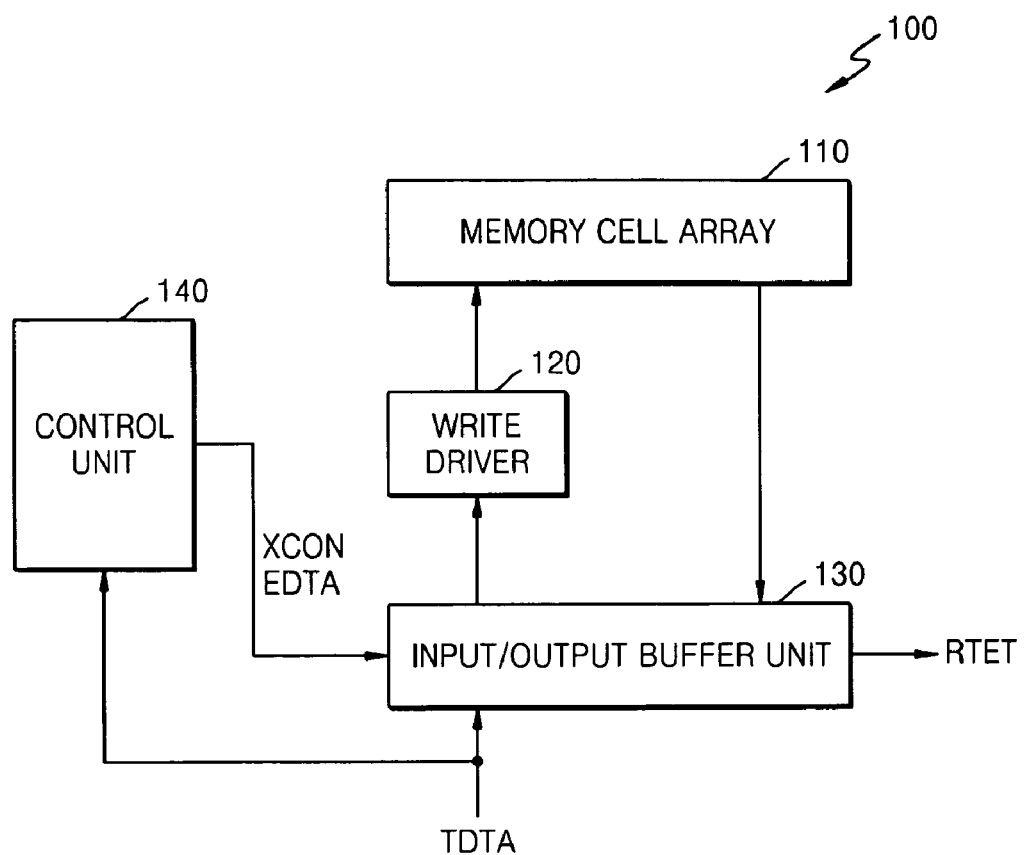
FIG. 1 is a schematic block diagram of a flash memory device according to an example embodiment.

Example embodiments will now be described more fully with reference to the accompanying drawings. Many alternate forms may be embodied and example embodiments should not be construed as limited to example embodiments set forth herein. In the drawings, the thicknesses of layers and regions may be exaggerated for clarity, and like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein to describe one element or a relationship between a feature and another element or feature as illustrated in the figures. It will be understood that spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

It should also be noted that in some alternative implementations, the functions/operations noted may occur out of the order noted in the figures. For example, two figures shown in succession may in fact be executed substantially concurrently, or may sometimes be executed in reverse order, depending upon the functions/operations involved.

Hereinafter, example embodiments will be described in detail with reference to the attached drawings. Like reference numerals in the drawings denote like elements.

FIG. 1 is a schematic block diagram of a flash memory device 100 according to an example embodiment. Referring to FIG. 1, the flash memory device 100 may include a memory cell array 110 and a peripheral circuit for performing programming or reading with respect to the memory cell array 110. The peripheral circuit may include an input/output buffer unit 130 and a write driver 120. The input/output buffer unit 130 buffers test data TDTA received from an external testing device (not shown), and the write driver 120 writes the test data TDTA to the memory cell array 110. Test data TDTA, which is read from the memory cell array 110, is subject to a testing operation according to an example embodiment.

The input/output buffer unit 130 outputs a test result signal RTET associated with whether a column of the memory cell array 110 is in a pass state. A pass state indicates that no defective cells exist and a fail state indicates that a defective cell exists.

The flash memory device 100 may further include a control unit 140 for controlling a testing operation of the memory cell array 110. The control unit 140 may transmit to the input/output buffer unit 130 estimated data EDTA corresponding to the test data TDTA and a control signal XCON which controls the testing operation according to a value of the estimated data EDTA. For example, the control signal XCON may be a first signal, or a second signal as described later.

The estimated data EDTA has the same value as the test data TDTA, which is programmed in a memory cell (not shown) in order to test the memory cell. In other words, when the test data TDTA is programmed in a normal cell other than a defective cell, the estimated data EDTA and the test data TDTA have the same bit values. However, when the test data TDTA is programmed in a defective cell, the estimated data EDTA and the test data TDTA have different bit values. In a flash memory testing method according to an example embodiment, the bit value of the test data TDTA read from the memory cell array 110 is compared with that of the estimated data EDTA.

Functions and operations of the components of the flash memory device 100 will now be described in greater detail.

Figure 2:
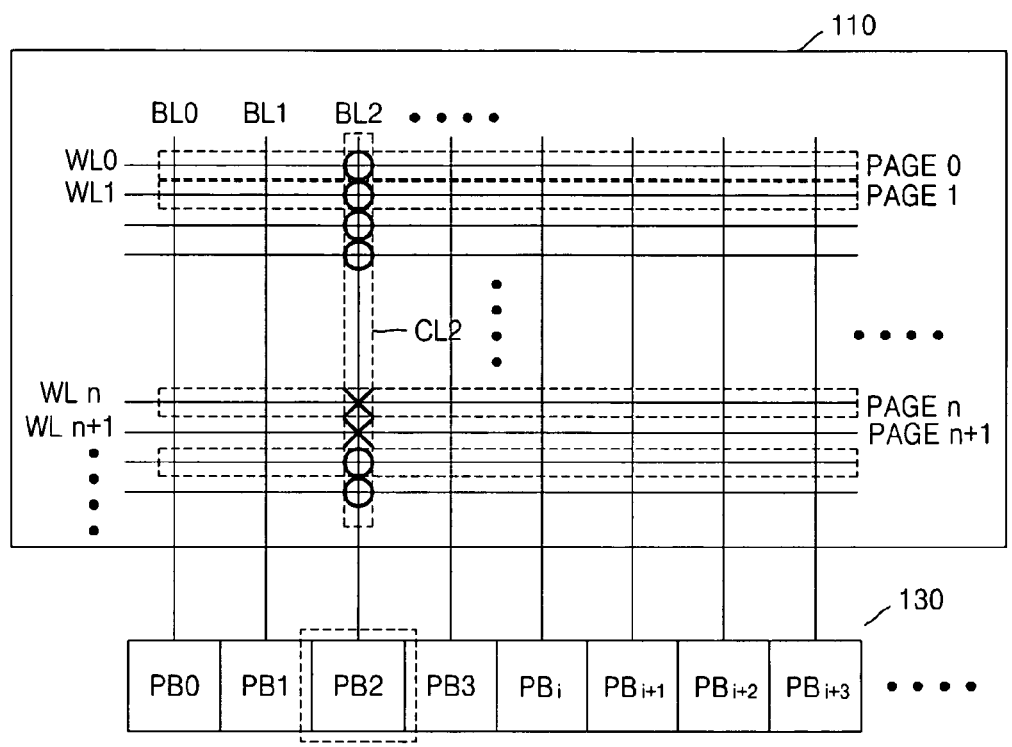
FIG. 2 illustrates an example embodiment where defective cells exist on a column of the flash memory device illustrated in FIG. 1.

FIG. 2 illustrates an example where defective cells exist on a column of the flash memory device 100 of FIG. 1. The defective cells are indicated by "X". Accordingly, FIG. 2 illustrates the memory cell array 110 in which a memory cell where a bit line BL2 is connected to a word line WLn and a memory cell where the bit line BL2 is connected to a word line WLn+1 are defective cells.

The input/output buffer unit 130 includes a plurality of page buffers PB0-PB$_{i+3}$ for performing write or read operations with respect to their corresponding columns (bit lines).

However, since the flash memory device 100 performs a repair operation in each column, a test result signal RTET representing whether each column is in a pass or failure state, is generated. As a result of a test operation on the memory cell array 110, the column CL2 is determined to be in a failure state.

Test result signals RTET are transmitted to the testing device (not shown) after all pages (word lines) are tested. Therefore, information about whether each column is in a pass or failure state is stored until the tests for all of the pages are finished. To achieve this, the flash memory device 100 operates as follows.

Figure 3:
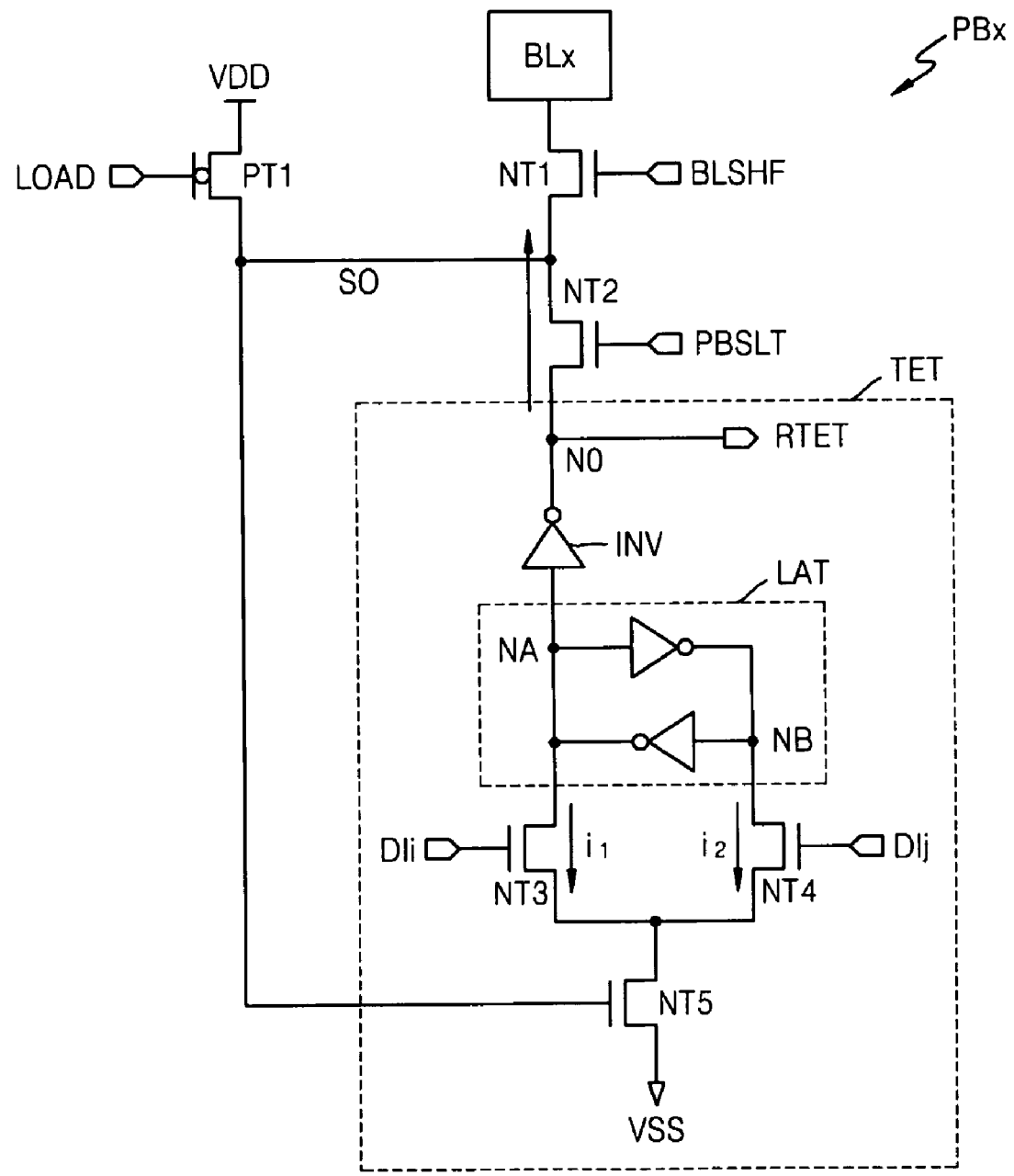
FIG. 3 illustrates a page buffer shown in FIG. 2, according to an example embodiment.

FIG. 3 illustrates a page buffer illustrated in FIG. 2, according to an example embodiment. Each of the page buffers PB0-PB$_{i+3}$ may be configured in the same manner as a page buffer PBx in FIG. 3.

Referring to FIG. 3, the page buffer PBx includes a PMOS transistor PT1 which is gated by a latch-control signal LOAD, and a first NMOS transistor NT1 which is connected to one terminal of the PMOS transistor PT1, is gated by a shut-off control signal BLSHF, and electrically connects or disconnects a bit line BLx to or from a sensing node SO.

The page buffer PBx further includes a second NMOS transistor NT2 which has one terminal connected to an output node NO, is gated by a precharge control signal PBSLT, and precharges the bit line BLx with a voltage corresponding to the output node NO.

The page buffer PBx further includes a testing unit TET which outputs a test result signal RTET. A logic state of the test result signal varies according to whether the bit values of the read-out test data and the estimated data are identical, namely, whether memory cells corresponding to the page buffer PBx are defective.

The testing unit TET will now be described in greater detail.

The testing unit TET includes a fifth NMOS transistor NT5 which is connected to one terminal of the PMOS transistor PT1 and turned on in response to a turned-on operation of the PMOS transistor PT1, and a third NMOS transistor NT3 and a fourth NMOS transistor NT4 which are connected to one terminal of the fifth NMOS transistor NT5 and form a current path $i_1$ for off-cells and a current path $i_2$ for on-cells, respectively, during sensing. The on-cells denote cells having bit values of "1", and the off-cells denote cells having bit values of "0".

The third NMOS transistor NT3 and the fourth NMOS transistor NT4 are turned on in response to the first signal DIi and the second signal DIj, respectively. The first signal DIi and the second signal DIj will be described in greater detail later.

Referring to FIG. 3, the testing unit TET further includes a latch LAT which is connected to the third NMOS transistor NT3 and the fourth NMOS transistor NT4 and differentiates logic levels of a first node NA and a second node NB according to the current path $i_i$ for off-cells and the current path $i_2$ for on-cells. The testing unit TET may further include an inverter INV which is connected between the first node NA of the latch LAT and an output node NO and thus inverts the logic level of a voltage of the first node NA. Accordingly, the output node NO outputs the test result signal RTET of which a logic state is different from that of the voltage of the first node NA.

Figure 4:
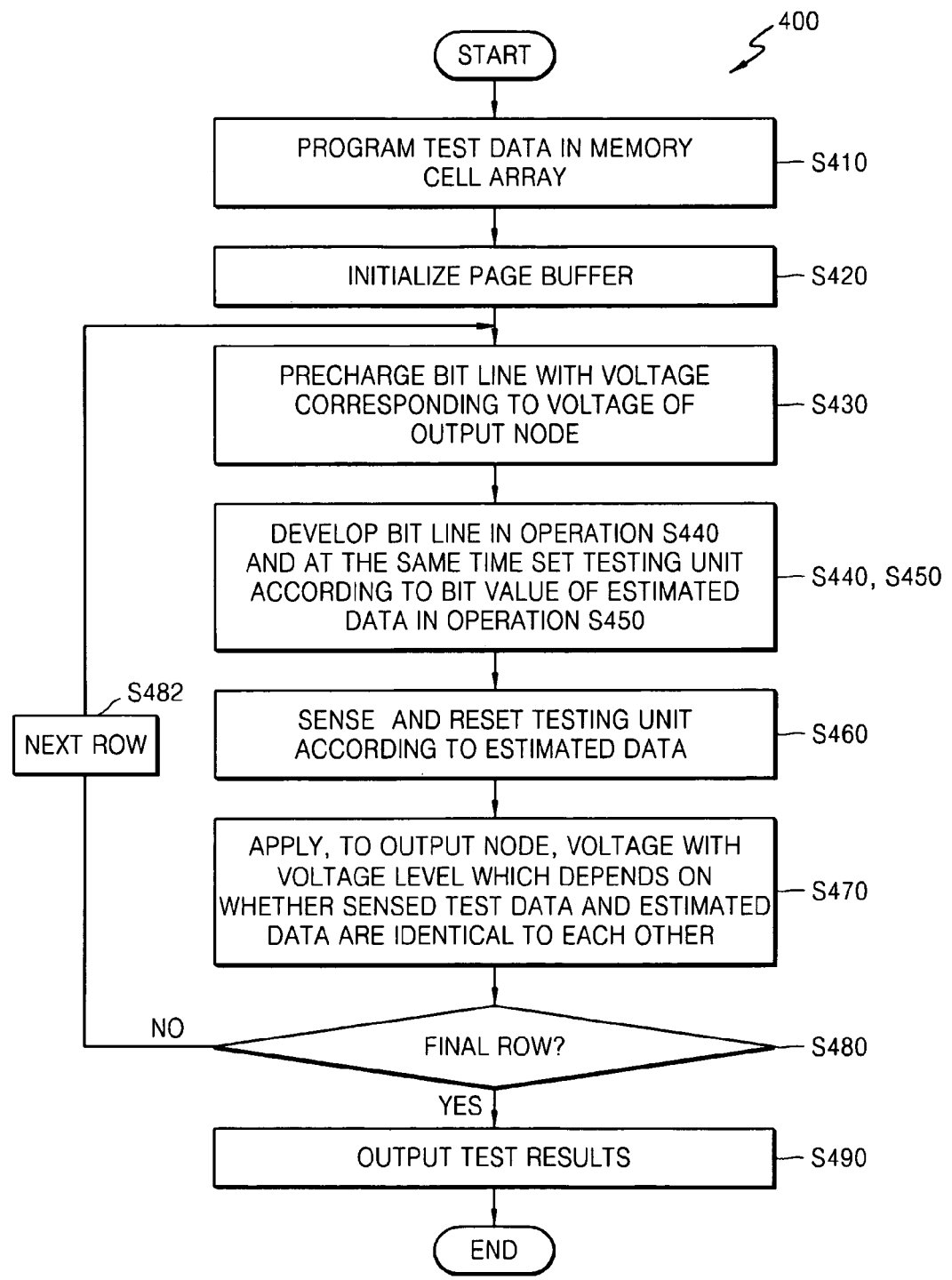
FIG. 4 illustrates a method of testing the flash memory device of FIG. 1, according to an example embodiment.

FIG. 4 is a flowchart of a method 400 of testing the flash memory device 100 of FIG. 1, according to an example embodiment.

Referring to FIGS. 1 through 4, in operation S410, the test data TDTA is programmed in the memory cell array 110. In operation S420, the page buffer PBx is initialized to test the flash memory device 100.

More specifically, in operation S420, the logic level of a voltage of the output node NO, that is, the logic level of the test result signal RTET is initialized. The test result signal RTET may be initialized to logic high "H". Thus, in order to initialize the test result signal RTET to logic high "H", the latch-control signal LOAD is applied to the PMOS transistor PT1 as logic low "L", and the first signal DIi is applied to the third NMOS transistor NT3 as logic high "H".

Accordingly, the current path $i_1$ from the first node NA to a ground voltage VSS is formed, and the voltage of the first node NA is logic low "L". Since the output node NO has a logic level that is different from that of the first node NA, the output node NO has a voltage level of logic high "H". Consequently, the test result signal RTET is initialized to logic high "H".

Then, a first page PAGE0 is subject to a testing operation. In operation S430, the bit line BLx of the first page PAGE0 is developed. At this time, the precharge control signal PBSLT and the shut-off control signal BLSHF are applied to the second NMOS transistor NT2 and the first NMOS transistor NT1, respectively. Thus, the first NMOS transistor NT1 and the second NMOS transistor NT2 are turned on, and the bit line BLx is precharged with a voltage corresponding to the voltage of the output node NO.

In the method 400, the bit line BLx is developed in operation S440, and at the same time the testing unit TET is set according to a bit value of the estimated data EDTA in operation S450.

For example, if the bit value of the estimated data EDTA is "0", the second signal DIj may be set to logic high "H". On the other hand, if the bit value of the estimated data EDTA is "1", the second signal DIj may be set to logic low "L". At this time, the latch-control signal LOAD and the first signal DIi may be set to logic low "L".

Accordingly, when the bit value of the estimated data EDTA is "0", the fourth NMOS transistor NT4 is turned on, and thus the current path $i_2$ from the second node NB to the ground voltage VSS is formed. In other words, the voltage of the second node NB is logic low "L". Consequently, a voltage of logic low "L" is applied to the output node NO.

On the other hand, when the bit value of the estimated data EDTA is "1", the fourth NMOS transistor NT4 is turned off and thus, the voltage of the second node NB is maintained at logic low "L". Consequently, a voltage of logic high "H" is applied to the output node NO.

In operation S450, the test result signal RTET having a logic level corresponding to the voltage level of the output node NO is not output to the outside of the page buffer PBx. The test result signal RTET is not transmitted to the testing device until all of the pages PAGE0, . . . , PAGEn and PAGEn+1 of the memory cell array 100 are tested.

Referring back to FIGS. 1 through 4, after the testing unit TET is set in operation S450, the bit line BLx is sensed, in operation S460.

When the read-out test data TDTA is "0", a voltage of logic high "H" may be applied to the sensing node SO. Accordingly, the fifth NMOS transistor NT5 is turned on, and thus the voltage levels of the first and second nodes NA and NB of the latch LAT may be changed.

On the other hand, when the read-out test data TDTA is "1", a voltage of logic low "L" may be applied to the sensing node SO. Accordingly, the fifth NMOS transistor NT5 is not turned on. In other words, when the read-out test data TDTA is "1", the voltage levels of the first and second nodes NA and NB of the latch LAT are not changed.

While the bit line BLx is being sensed, the testing unit TET may be re-set, in operation S460. For example, when the bit value of the estimated data EDTA is "0", the first signal DIi may be set to logic high "H". On the other hand, when the bit value of the estimated data EDTA is "1", the second signal DIj may be set to logic high "H".

Accordingly, when the bit values of the estimated data EDTA and the read-out test data TDTA are both "0", the output node NO has a voltage level of logic high "H", in operation S470. This is because, in operation S460, when the read-out test data TDTA is "0", the fifth NMOS transistor NT5 is turned on, and the third NMOS transistor NT5 is turned on in response to the first signal DIi of logic high "H". In other words, operation S470 is performed because due to the formation of the current path $i_1$ from the first node NA to the ground voltage VSS, the voltage of the first node NA becomes a voltage of logic low "L".

Even when the bit values of the estimated data EDTA and the read-out test data TDTA are both "1", the output node NO has a voltage level of logic high "H", in operation S470. This is because, in operation S460, when the read-out test data TDTA is "1", the fifth NMOS transistor NT5 is not turned on. In other words, operation S470 is performed because, in operation S460, when the bit value of the estimated data EDTA is "1", the fourth NMOS transistor NT4 is not turned on, and thus the logic low "L" voltage of the second node NB is kept.

When the estimated data EDTA and the test data TDTA have identical bit values, that is, when a cell from which the test data is read is not defective, the output node NO has a voltage level of logic high "H", in operation S470. On the other hand, when the estimated data EDTA and the test data TDTA have different bit values, that is, when the cell from which the test data is read is defective, the output node NO has a voltage level of logic low "L", in operation S470.

In operation S450, when the bit value of the estimated data EDTA is "0", the output node NO is set to have a voltage of logic low "L". However, in operation S460, when the bit value of the read-out test data TDTA is "1", the fifth NMOS transistor NT5 is not turned on. In other words, the voltage of the output node NO is maintained at a voltage level of logic low "L".

When the bit value of the estimated data EDTA is "1" and the bit value of the read-out test data TDTA is "0", the voltage of the output node NO has a voltage level of logic low "L". More specifically, in operation S450, when the bit value of the estimated data EDTA is "1", the output node NO is set to have a voltage of logic high "H". However, in operation S460, when the bit value of the read-out test data TDTA is "0", the fifth NMOS transistor NT5 is turned on. In addition, in operation S460, since the bit value of the estimated data EDTA is "1", the fourth NMOS transistor NT4 is turned on. Accordingly, the voltages of the second node NB and the output node NO have voltage levels of logic low "L".

If the tested page is the final row at S490, the test results are output at S490. Otherwise, testing begins on a next row at S482. After the first page PAGE0 is tested, a second page PAGE1 may be subject to a testing operation, in operation S482. At this time, when no defective cells are detected from all of the columns of the first page PAGE0, the testing operation on the second page PAGE1 is the same as that on the first page PAGE0 except that the programming operation S410 and the initializing operation S420 are not performed. Similarly, when no defective cells are detected from all of the columns of the second page PAGE1 as a result of the testing of the second page PAGE1, the same testing operation is performed on the next page.

However, in the page buffer PB2 performing a testing operation on the column CL2 of FIG. 2, since a defective cell exists in the column CL2 as a result of the testing on the page PAGEn, the voltage of the output node NO is logic low "L".

Although the page buffer PB2 performs testing on the next page PAGEn+1, the voltage of the output node NO is maintained at logic low "L". Referring to FIGS. 3 and 4, when the output node NO has a voltage (for example, 0V) of logic low "L", the sensing node SO has the voltage of logic low "L" during a testing operation on the next page, and the fifth NMOS transistor NT5 is not turned on. Accordingly, the voltage level of the output node NO is not changed.

In other words, if a defective cell exists in a column, the voltage of the output node NO of the page buffer corresponding to the column is always logic low "L".

Referring to FIGS. 3 and 4, when all of the pages of the memory cell array 110 are completely tested (that is, when the determination of operation S480 is "Yes"), test result signals for respective columns are output, in operation S490. In other words, after testing operations on all of the pages are completed, if a column corresponding to one of the page buffers PB0-PB$_{i+3}$ is in a pass state, the corresponding page buffer PB0-PB$_{i+3}$ outputs a test result signal RTET of logic high "H". On the other hand, if the column corresponding to one of the page buffers PB0-PB$_{i+3}$ is in a failure state, the corresponding page buffer PB0-PB$_{i+3}$ outputs a test result signal RTET of logic low "L".

As such, in the flash memory device 100 and the method of testing the flash memory device 100 according to the current embodiment, information about pass states or failure states of each column for the pages of the memory cell array 110 may be accumulated in each page buffer. Therefore, without including a special storage unit, test result signals may be transmitted to the testing device after the testing operations on all of the pages. Consequently, the time required to perform the testing operations may be decreased without an additional design and a process change.

Signals or transistors not mentioned in the description of each of the operations S410 through S490 are not activated during S410 and S490. For example, the first signal DIi, which is not mentioned in the description of the operation S450 of setting the testing unit TET, is applied in a logic low state, and the third NMOS transistor NT3 is inactive.

FIG. 5 is a table showing the logic levels of signals and nodes illustrated in FIG. 3 according to operations S420, S430, S450, and S460 of FIG. 4. In FIG. 5, "Don't care" represents that the logic level of a corresponding signal or node may have any value. An arrow shown in FIG. 5 indicates that a corresponding signal or node has a logic level as indicated on the right side of the arrow according to a condition indicated on the left side thereof. For example, when the estimated data EDTA is 0, the second signal in operation S450 is logic high "H".

Figure 6:
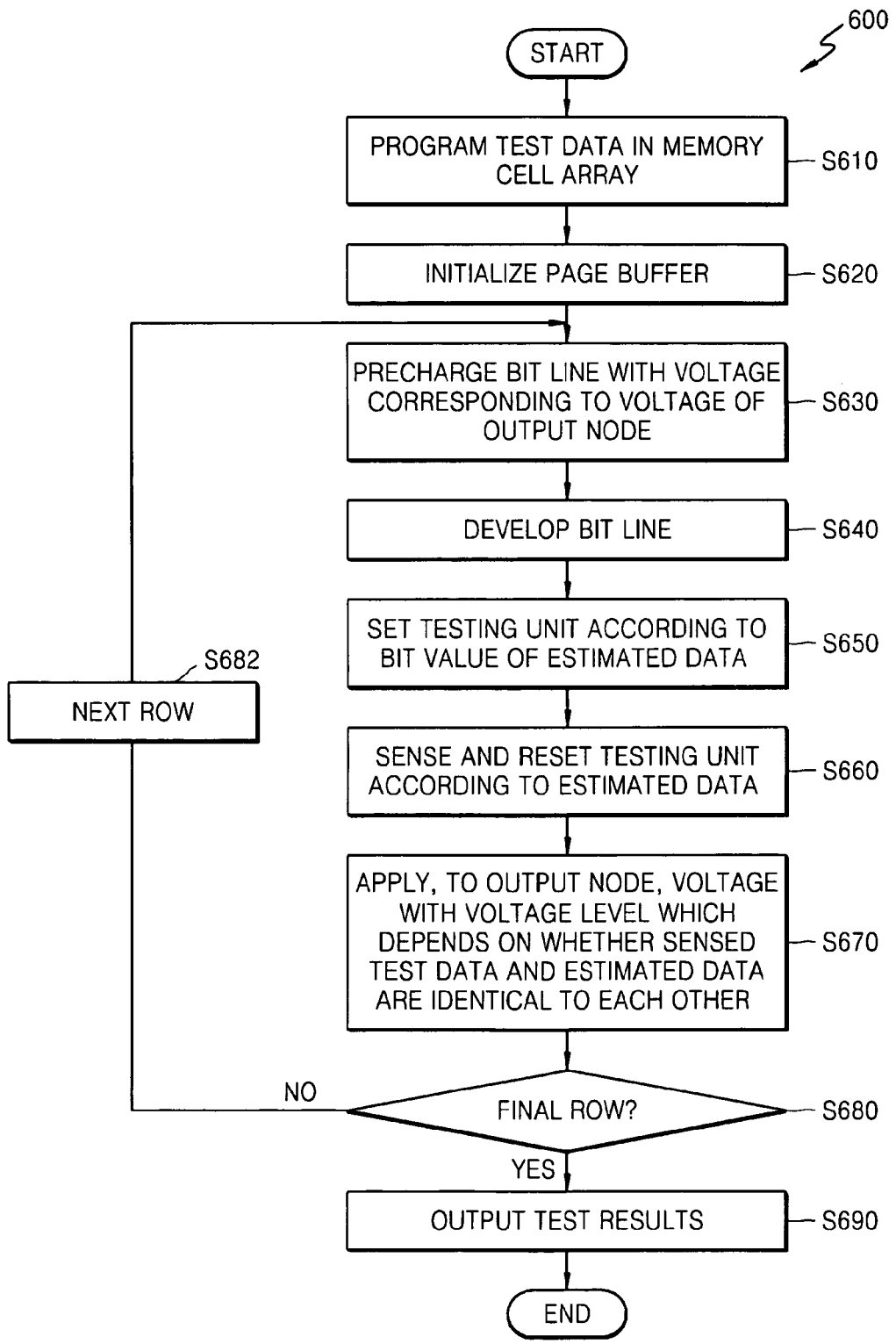
FIG. 6 illustrates a method of testing the flash memory device of FIG. 1, according to another example embodiment.

FIG. 6 is a flowchart of a method 600 of testing the flash memory device of FIG. 1, according to another example embodiment. Referring to FIG. 6, the method 600 is the same as the method 400 of FIG. 4 except that after the bit line is developed in operation S640, the testing unit TET is set in operation S650. In the method 600, until the setting of the testing unit TET is completed, the precharge control signal PBSLT and the shut-off control signal BLSHF can be maintained at logic high "H".

Figure 7:
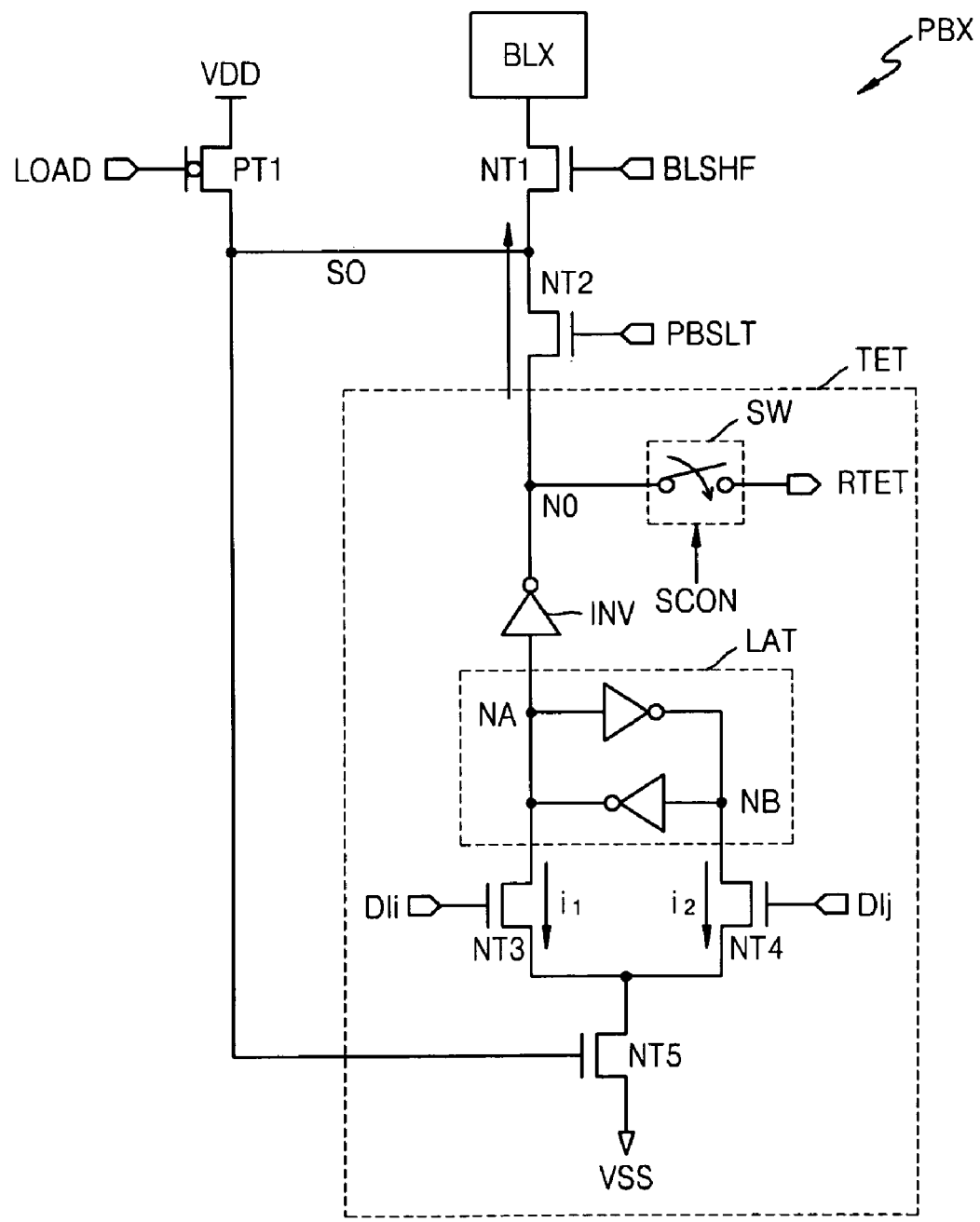
FIG. 7 illustrates a page buffer shown in FIG. 2, according to another example embodiment.

FIG. 7 illustrates a page buffer, illustrated in FIG. 2, according to another example embodiment. Each of the page buffers PB0-PB$_{i+3}$ may be configured as a page buffer PBx shown in FIG. 3. Referring to FIG. 7, the page buffer PBx includes a switch SW which is connected to an output node NO. The switch SW may output a test result signal RTET corresponding to the voltage level of the output node NO in response to a switching signal SCON which is applied when a test on all of the pages of the memory cell array 110 is completed.

While example embodiments have been particularly shown and described, it will be understood that various changes in form and details may be made therein without departing from the spirit and scope of the following claims.

What is claimed is:
1. A flash memory device comprising:
a memory cell array including a plurality of bit lines;
a control unit configured to output estimated data; and
an input/output buffer unit including a plurality of page buffers, each of the plurality of page buffers corresponding to one of the plurality of bit lines in the memory cell array and configured to read test data programmed in at least a first page of a memory cell array, compare the read-out test data with the estimated data to determine whether the corresponding bit line is in a pass or failure state and output a test result signal, wherein
a voltage of the test result signal is maintained when test data of a second page of the memory cell array is read if the corresponding bit line in the first page is in a failure state wherein
each of the plurality of page buffers is configured to output the test result signal if every page in the memory cell array to be tested is tested, and
each of the plurality of page buffers includes, an output node to output the test result signal, the test result signal indicating whether the bit line corresponding to the page buffer is in a pass state or the failure state, a precharge transistor located between the bit line corresponding to the page buffer from and the output node, the precharge transistor configured to precharge the bit line corresponding to the page buffer with a voltage of the output node based on a precharge control signal, a sensing node connected to the bit line and configured to receive a voltage corresponding to a bit value of the test data read from the precharged bit line, and a latch configured to be active or inactive based on the voltage of the sensing node and output a voltage based on whether the read-out test data and the estimated data are identical.

2. The flash memory device of claim 1, wherein the bit line is not precharged when a second page is tested after the testing of the first page if the bit line is in the failure state and the latch is inactive.

3. The flash memory device of claim 2, wherein the test result signal has an identical logic level for all pages that are tested after the first page.

4. The flash memory device of claim 1, wherein the flash memory device further comprises:

a first transistor connected between a first node of the latch and a source of a ground voltage, and generating a first current path in response to a first signal, and a second transistor connected between a second node of the latch and the source of the ground voltage, and generating a second current path in response to a second signal, the first node having a voltage which is reverse to the voltage of the output node and the second node having a voltage which is reverse to the voltage of the first node.

5. The flash memory device of claim 4, wherein while the precharged bit line is being developed, the control unit is configured to set the sensing node voltage to a first logic level to activate the latch.

6. The flash memory device of claim 5, wherein the control unit is configured to set logic levels of at least one of the first and second signals so that at least one of the first and second current paths depends on a bit value of the estimated data.

7. The flash memory device of claim 6, wherein each of the page buffers further includes a load transistor which is configured to set the sensing node voltage to a first logic level based on a third signal transmitted from the controller.

8. The flash memory device of claim 1, wherein each of the page buffers further includes a switch which is connected to the output node and outputs the test signal based on a switching signal received from the control unit when all of the pages of the memory cell array are tested.

9. A method of testing the flash memory device of claim 1, the method comprising:

programming the test data in the memory cell array;
precharging the bit line with a voltage corresponding to the voltage of the output node;
developing the precharged bit line;
setting the voltage of the first node of the latch connected to the output node, according to the estimated data, while the bit line is being developed or after the bit line is developed;
sensing the bit line; and
maintaining or inverting the voltage of the first node of the latch according to whether the voltage of the sensing node is identical with the voltage of the estimated data.

10. The flash memory device of claim 1, wherein each of the plurality of page buffers includes, a first NMOS transistor having a first terminal coupled to the corresponding bit line and a second terminal coupled to a second terminal of first PMOS transistor, a first terminal of the precharge transistor and a gate of a fifth NMOS transistor, and a testing unit including the fifth NMOS transistor and an output node coupled to a second terminal of the precharge transistor.

11. The flash memory device of claim 10, wherein the testing unit further includes, third and fourth transistors, second terminals of the third and fourth transistors being coupled to a first terminal of the fifth NMOS transistor, a latch being coupled to first terminals of the third and fourth transistors and the output node.

12. The flash memory device of claim 11, wherein the testing unit further includes, a switch connected to the output node and is configured to output the test signal based on a switching signal received from the control unit when all of the pages of the memory cell array are tested.

13. The flash memory device of claim 11, wherein first and second signals are input to gates of the third and fourth transistors, respectively, the first and second signals being based on the estimated data.

14. The flash memory device of claim 10, wherein a shut-off control signal is input to a gate of the first NMOS transistor, a latch-control signal is input to a gate of the first PMOS transistor, and a precharge control signal is input to a gate of the precharge transistor.

15. A flash memory device comprising:

a memory cell array including a plurality of bit lines;
a control unit configured to output estimated data; and
an input/output buffer unit including a plurality of page buffers, each of the plurality of page buffers corresponding to a bit line in the memory cell array and configured to read test data programmed in at least a first page of a memory cell array, compare the read-out test data with the estimated data to determine whether the corresponding bit line is in a pass or failure state and output a test result signal, wherein each of the plurality of page buffers is configured to output the test result signal if every page in the memory cell array to be tested is tested, a voltage of the test result signal is maintained when test data of a second page of the memory cell array is read if the corresponding bit line in the first page is in a failure state, and each of the plurality of page buffers includes, an output node to output the test result signal, the test result signal indicating whether the bit line corresponding to the page buffer is in a pass state or the failure state, a precharge transistor located between the bit line corresponding to the page buffer from and the output node, the precharge transistor configured to precharge the bit line corresponding to the page buffer with a voltage of the output node based on a precharge control signal, a sensing node connected to the bit line and configured to receive a voltage corresponding to a bit value of the test data read from the precharged bit line, and a latch configured to be active or inactive based on the voltage of the sensing node and output a voltage based on whether the read-out test data and the estimated data are identical.

16. The flash memory device of claim 15, wherein each of the plurality of page buffers includes, a first NMOS transistor having a first terminal coupled to the corresponding bit line and a second terminal coupled to a second terminal of a first PMOS transistor, a first terminal of the precharge transistor and a gate of a fifth NMOS transistor, and a testing unit including the fifth NMOS transistor and an output node coupled to a second terminal of the precharge transistor.

* * * * *